United States Patent [19]
Vijayan et al.

[11] Patent Number: 6,151,296
[45] Date of Patent: Nov. 21, 2000

[54] BIT INTERLEAVING FOR ORTHOGONAL FREQUENCY DIVISION MULTIPLEXING IN THE TRANSMISSION OF DIGITAL SIGNALS

[75] Inventors: Rajiv Vijayan, San Diego; Joseph P. Odenwalder, Del Mar; Jack K. Wolf, La Jolla; Chong U. Lee, San Diego, all of Calif.; Ephraim Zehavi, Haifa, Israel

[73] Assignee: Qualcomm Incorporated, San Diego, Calif.

[21] Appl. No.: 08/879,297

[22] Filed: Jun. 19, 1997

[51] Int. Cl.[7] .............................. H04J 11/00; H04L 27/06
[52] U.S. Cl. .......................... 370/208; 370/206; 375/340
[58] Field of Search ..................... 375/340, 295; 370/203, 208, 206, 210; 371/37.5, 37.11, 43.7; 714/755, 784

[56] References Cited

U.S. PATENT DOCUMENTS

| | | | |
|---|---|---|---|
| 4,881,241 | 11/1989 | Pommier et al. | 714/795 |
| 5,197,061 | 3/1993 | Halbert-Lassalle et al. | 370/204 |
| 5,392,299 | 2/1995 | Rhines et al. | 371/37.5 |
| 5,416,801 | 5/1995 | Chouly et al. | 375/260 |
| 5,682,376 | 10/1997 | Hayashino et al. | 370/210 |
| 5,790,550 | 8/1998 | Peeters et al. | 370/480 |

FOREIGN PATENT DOCUMENTS

| | | | |
|---|---|---|---|
| 0682426 | 5/1995 | European Pat. Off. | H04L 5/06 |
| 9616496 | 5/1996 | WIPO | H04L 27/34 |
| 9832256 | 7/1998 | WIPO | H04L 1/00 |

*Primary Examiner*—Huy D. Vu
*Assistant Examiner*—Kevin C. Harper
*Attorney, Agent, or Firm*—Gregory D. Ogrod; Sandip S. Minhas

[57] ABSTRACT

In an orthogonal frequency division multiplexing (OFDM) system which uses an outer Reed-Solomon encoder and interleaver an inner convolutional encoder, after the inner convolutional encoding the data bits are interleaved, and then grouped into symbols, each symbol having "m" bits. After grouping, the symbols are mapped to a complex plane using quadrature amplitude modulation (QAM). Thus, bits, not symbols, are interleaved by the inner interleaver. A receiver performs a soft decision regarding the value of each bit in each complex QAM symbol received.

10 Claims, 2 Drawing Sheets

BIT INTERLEAVING FOR ORTHOGONAL FREQUENCY DIVISION MULTIPLEXING IN THE TRANSMISSION OF DIGITAL SIGNALS

BACKGROUND OF THE INVENTION

I. Field of the Invention

The present invention relates generally to the transmission of high rate digital signals such as high definition television (HDTV) signals, and more particularly to orthogonal frequency division multiplexing (OFDM) systems that are used in the transmission of digital signals.

II. Description of the Related Art

Orthogonal frequency division multiplexing (OFDM) is a technique for broadcasting high rate digital signals such as high definition television (HDTV) signals. In OFDM systems, a single high rate data stream is divided into several parallel low rate substreams, with each substream being used to modulate a respective subcarrier frequency. It should be noted that although the present invention is described in terms of quadrature amplitude modulation, it is equally applicable to phase shift keyed modulation systems.

The modulation technique used in OFDM systems is referred to as quadrature amplitude modulation (QAM), in which both the phase and the amplitude of the carrier frequency are modulated. In QAM modulation, complex QAM symbols are generated from plural data bits, with each symbol including a real number term and an imaginary number term and with each symbol representing the plural data bits from which it was generated. A plurality of QAM bits are transmitted together in a pattern that can be graphically represented by a complex plane. Typically, the pattern is referred to as a "constellation". By using QAM modulation, an OFDM system can improve its efficiency.

It happens that when a signal is broadcast, it can propagate to a receiver by more than one path. For example, a signal from a single transmitter can propagate along a straight line to a receiver, and it can also be reflected off of physical objects to propagate along a different path to the receiver. Moreover, it happens that when a system uses a so-called "cellular" broadcasting technique to increase spectral efficiency, a signal intended for a received might be broadcast by more than one transmitter. Hence, the same signal will be transmitted to the receiver along more than one path. Such parallel propagation of signals, whether man-made (i.e., caused by broadcasting the same signal from more than one transmitter) or natural (i.e., caused by echoes) is referred to as "multipath". It can be readily appreciated that while cellular digital broadcasting is spectrally efficient, provisions must be made to effectively address multipath considerations.

Fortunately, OFDM systems that use QAM modulation are more effective in the presence of multipath conditions (which, as stated above, must arise when cellular broadcasting techniques are used) than are QAM modulation techniques in which only a single carrier frequency is used. More particularly, in single carrier QAM systems, a complex equalizer must be used to equalize channels that have echoes as strong as the primary path, and such equalization is difficult to execute. In contrast, in OFDM systems the need for complex equalizers can be eliminated altogether simply by inserting a guard interval of appropriate length at the beginning of each symbol. Accordingly, OFDM systems that use QAM modulation are preferred when multipath conditions are expected.

With particular regard to current OFDM systems to understand why the present invention is useful and needed, in current systems the data stream to be broadcast is encoded twice, first with a Reed-Solomon encoder and then with a trellis coding scheme. It should be noted that the present invention is equally applicable to systems in which there is only one coding. In a typical trellis coding scheme, the data stream is encoded with a convolutional encoder and then successive bits are combined in a bit group that will become a QAM symbol. Several bits are in a group, with the number of bits per group being defined by an integer "m" (hence, each group is referred to as having an "m-ary" dimension). Typically, the value of "m" is four, five, six, or seven, although it can be more or less.

After grouping the bits into multi-bit symbols, the symbols are interleaved. By "interleaving" is meant that the symbol stream is rearranged in sequence, to thereby randomize potential errors caused by channel degradation. To illustrate, suppose five words are to be transmitted. If, during transmission of a non-interleaved signal, a temporary channel disturbance occurs. Under these circumstances, an entire word can be lost before the channel disturbance abates, and it can be difficult if not impossible to know what information had been conveyed by the lost word.

In contrast, if the letters of the five words are sequentially rearranged (i.e., "interleaved") prior to transmission and a channel disturbance occurs, several letters might be lost, perhaps one letter per word. Upon decoding the rearranged letters, however, all five words would appear, albeit with several of the words missing letters. It will be readily appreciated that under these circumstances, it would be relatively easy for a digital decoder to recover the data substantially in its entirety. After interleaving the m-ary symbols, the symbols are mapped to complex symbols using QAM principles noted above, multiplexed into their respective sub-carrier channels, and transmitted.

As recognized by the present invention, however, current OFDM systems that use the above-mentioned trellis coding scheme, in which data bits are grouped into symbols prior to interleaving, exhibit performance shortcomings in the presence of multipath conditions in which some of the OFDM sub-carriers are severely attenuated. As further recognized herein, it is possible to improve the performance of OFDM systems in the presence of sub-carrier attenuation caused by multipath conditions. As still further recognized by the present invention, the performance of such an OFDM system can be further improved by undertaking soft decision-making at the receiver in determining received data values.

Accordingly, it is an object of the present invention to provide a system for transmitting high rate digital data in the presence of multipath conditions. Another object of the present invention is to provide a system for transmitting high rate digital data using OFDM principles, which performs comparatively effectively in the presence of sub-carrier attenuation in multipath conditions. Still another object of the present invention is to provide a system for receiving high rate digital data which permits the use of soft decision making on a sub-channel by sub-channel basis to determine data values. Yet another object of the present invention is to provide a system for transmitting high rate digital data that is easy to use and cost-effective to manufacture and implement.

SUMMARY OF THE INVENTION

In an orthogonal frequency division multiplexing (OFDM) transmitter, a device is disclosed for processing digital data bits for transmission thereof to a receiver. The device includes an outer interleaver, preferably a Reed- Solomon code symbol interleaver, for processing the data bits and an inner interleaver for receiving the processed output data bits from the outer interleaver and interleaving the data bits. Also, the device includes means for receiving the interleaved data bits from the inner interleaver and generating a symbol representative of "m" successive bits from the inner interleaver, wherein "m" is an integer greater than one.

In the preferred embodiment, a convolutional encoder processes bits between the inner and outer interleavers. Moreover, a means is provided for mapping each symbol to m-ary signal space. As intended by the preferred embodiment, the mapping means uses quadrature amplitude modulation (QAM) to thereby generate complex symbols. In the case wherein "m" is an odd integer at least equal to five (5), the mapping means minimizes the sum of the Hamming distances between neighboring symbols in a quadrant of the signal space.

As disclosed in further detail below, a serial to parallel converter processes the complex symbols into "n" substreams, wherein "n" is an integer greater than one. A guard period generator establishes a guard period in the signal streams. The device is disclosed in combination with the OFDM transmitter, and in further combination with an OFDM system.

In another aspect, a method for transmitting digital data bits using orthogonal frequency division multiplexing (OFDM) includes convolutionally encoding the bits, then interleaving the bits. Next, the method includes grouping "m" bits in parallel to establish a respective symbol.

In yet another aspect, for a receiver receiving "n" substreams of an orthogonal frequency division multiplexed (OFDM) signal containing complex phase-adjusted symbols, wherein each symbol represents "m" data bits, a device is disclosed which includes, for each substream, a soft decision quantizer for determining a binary value of each bit represented by each symbol in the substream. A computer logic device is also disclosed for undertaking this part of the receiver function.

In still another aspect, a device is disclosed for transmitting orthogonal frequency division multiplexing (OFDM) signals. The device includes quadrature amplitude modulation (QAM) means for generating a plurality of QAM symbols. Also, the device includes mapping means for mapping the symbols to m-ary space such that the sum of the Hamming distances between neighboring symbols in the space is minimized, wherein m is an odd integer at least equal to five (5).

The details of the present invention, both as to its structure and operation, can best be understood in reference to the accompanying drawings, in which like reference numerals refer to like parts, and in which:

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
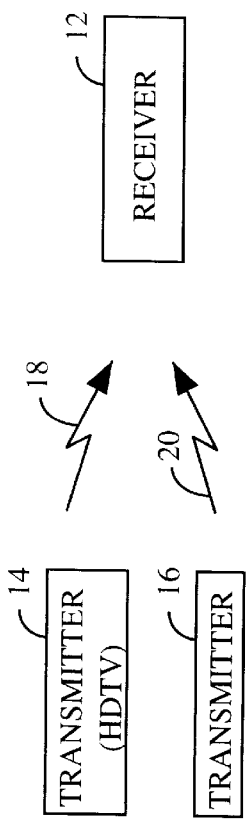
FIG. 1 is a schematic diagram of a digital signal transmission system of the present invention.

Referring initially to FIG. 1, a system is shown, generally designated 10, for broadcasting high rate digital data to a receiver 12 from one or more essentially identical transmitters 14, 16 via multiple air interface paths 18, 20. In accordance with the present invention, the system 10 is an orthogonal frequency division multiplexing (OFDM) system. Accordingly, the transmitters 14, 16 transmit identical signals to the receiver 12, with each signal being multiplexed into a plurality of "n" subchannels, wherein "n" is an integer greater than one (1). In accordance with OFDM principles, each subchannel represents a respective substream of a sequence of complex quadrature amplitude modulated (QAM) symbols. In turn, each QAM symbol represents "m" data bits, wherein "m" is an integer greater than one (1). In one presently preferred embodiment, the value of "m" is six (6). In another preferred embodiment, the value of "m" is seven (7).

Figure 2:
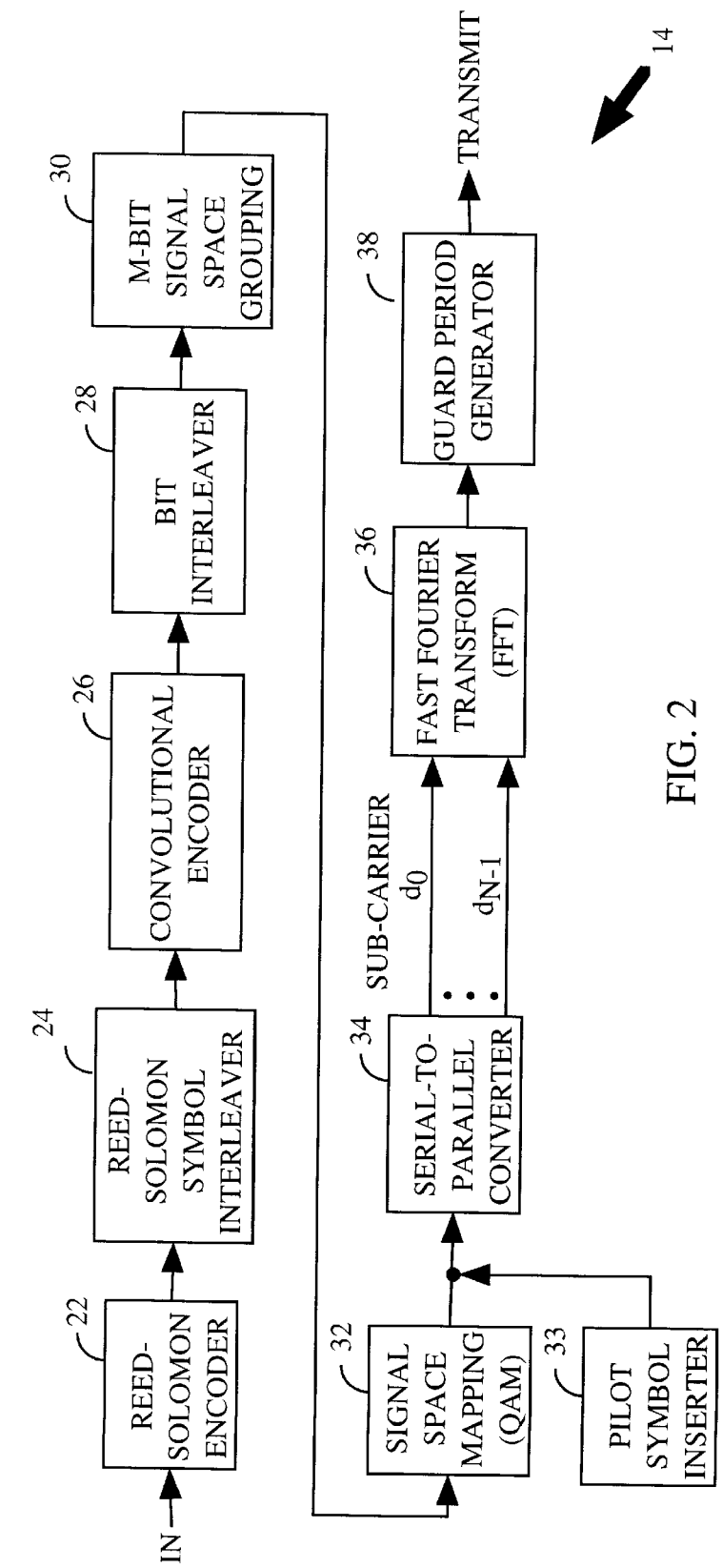
FIG. 2 is a schematic diagram showing the relevant portions of a transmitter of the present invention.

FIG. 2 shows the relevant details of the transmitter 14 of the present invention. An outer symbol error-correcting encoder such as a Reed-Solomon encoder 22 receives a stream of digital data bits to be transmitted and encodes the bits according to principles known in the art. Likewise, an outer interleaver 24, preferably a Reed-Solomon symbol interleaver, interleaves the data from the outer encoder 22 in accordance with principles known in the art. Reed-Solomon coding systems are discussed in G. C. Clark, Jr. and J. B. Cain, "Error-Correction Coding for Digital Communications", Plenum Press, New York, 1981; S. Lin and D. J. Costello, Jr., "Error Control Coding: Fundamentals and Applications", Prentice-Hall, Englewood Cliffs, N.J. 1983.

From the outer interleaver 24, the signal is sent to a convolutional encoder 26, which convolutionally encodes the data bits per well-known principles. The data bits are then sent to an inner interleaver 28, which interleaves the bits. Then, the interleaved bits are sent to a signal space grouper 30.

Per the present invention, the signal space grouper 30 groups in parallel a sequence of "m" bits from the inner interleaver 28. Thus, the signal space grouper establishes a respective symbol that is representative of each of "m" sequential bits received from the inner interleaver 28.

Accordingly, it can now be appreciated that the transmitter 14, unlike trellis-coded OFDM transmitters, processes the data bits through an inner interleaver prior to grouping the bits into multi-bit symbols. We have discovered that with this structure and the structure of the receiver 12 discussed below, the diversity and performance of the system 10 is improved in multipath conditions, vis-à-vis conventional trellis-coded transmitters which first group data bits into symbols, and then process the symbols through an inner interleaver.

As shown in FIG. 2, the symbols from the signal space grouper 30 are sent to a signal space mapping element 32. In accordance with the present invention, the signal space mapping element 32 maps each symbol to m-ary signal space. Preferably, the mapping element uses quadrature amplitude modulation (QAM) to create a modulation in both amplitude and phase based on each symbol to thereby generate complex symbols.

These complex symbols are mapped to a complex plane, sometimes referred to as a QAM constellation. Accordingly, each complex symbol can be expressed in terms of its x-y location in the complex plane as "x+jy", wherein j is the square root of negative one ($j=\sqrt{-1}$).

For even values of "m", the mapping to the complex plane is undertaken using m/2 Gray coded binary digits for the x-coordinates and to use the remaining m/2 binary digits (Gray coded) to represent the y-coordinate. In such mapping, adjacent bits in a quadrant of the complex plane advantageously differ from each other in value by only a single binary value. In other words, the so-called Hamming distance between adjacent bits in a quadrant is exactly one (1).

In contrast, for odd values of "m", because the QAM constellation is no longer rectangular, the QAM symbols can no longer be independently Gray coded in two dimensions. Accordingly, for odd values of "m", the QAM symbols are mapped using what might be thought of as a quasi-Gray code, shown in Table 1 below, to advantageously minimize the sum of the Hamming distances between (the m bits assigned to) every distinct pair of neighboring elements in a quadrant (that is, same-quadrant elements that are physically represented in the table as being next to each other, with no intervening elements).

TABLE 1

|   | f | e | e | f |   |
|---|---|---|---|---|---|
| g | d | c | c | d | g |
| h | b | a | a | b | h |
| h | b | a | a | b | h |
| g | d | c | c | d | g |
|   | f | e | e | f |   |

As those skilled in the art will readily recognize, the constellation shown in Table 1 can be thought of as including four quadrants, with the origin of the constellation being between the third row and fourth row and third column and fourth column. Per the present invention two of the "m" bits of represented by each QAM symbol code the quadrant of the symbol. Thus, two of the bits of the QAM symbols in the first quadrant are 00, two bits of each symbol in the second quadrant are 01, two bits of each symbol in the third quadrant are 11, and two bits of each symbol in the fourth quadrant are 10.

Accordingly, in Table 1, the three remaining bits of each symbol are denoted by one of the eight letters a–h. The first quadrant symbol assignments are discussed below, but it is to be understood that as shown in Table 1, the same bit assignment is reflected in the other three quadrants. Any letter may arbitrarily be assigned the value "000"; for example, the letter "a" can represent the binary value "000". To keep the Hamming distance to its neighbors in its quadrant equal to unity, the present invention assigns b=001 and c=010. This in turn leads to d=011, e=110, and f=111.

Two possibilities for the remaining assignments exist, in minimizing the sum of the symbol-to-symbol Hamming distances in the quadrant. The first is to assign g=100 and h=101, in which case the Hamming distance between all neighbors in the quadrant is 1, except for the Hamming distance between d and g, which is three. Or, g=101 and h=100, in which case the Hamming distance between neighbors in the quadrant is 1, except for the Hamming distance between d and g, which is two, and the Hamming distance between b and h, which is two. Both cases, however, minimize the sum of the neighbor-to-neighbor Hamming distances in the quadrant.

Table 1 is a mapping for the case m=5. It is to be understood, however, that the principles set forth herein apply to greater odd values of "m". For example, for "m">5 and odd, each point in Table 1 above is replaced by a square array of $2^{(m-5)}$ points, such that five of the bits of each symbol are used to identify particular square arrays and the remaining m–5 bits are used as a two-dimensional Gray code to enumerate the points in the square array.

After mapping, the stream of complex symbols is multiplexed into substreams by a serial to parallel converter 34. As the converter 34 multiplexes the symbols, it inserts pilot symbols into "n" substreams $d_0 \ldots d_{n-1}$ as shown. As the skilled artisan will recognize, the pilot signals establish an amplitude and phase reference for a receiver, such as the receiver 12, to use to determine the scale and phase of received complex symbols.

After multiplexing, the substreams are transformed to the frequency domain by a fast Fourier transformer (FFT) 36. Then, a guard period generator 38 receives the output signal of the FFT 36 and establishes guard periods in the output signal. In the preferred embodiment, the guard periods are established by inserting into the signal a cyclic extension of the information-bearing symbol.

Figure 3:
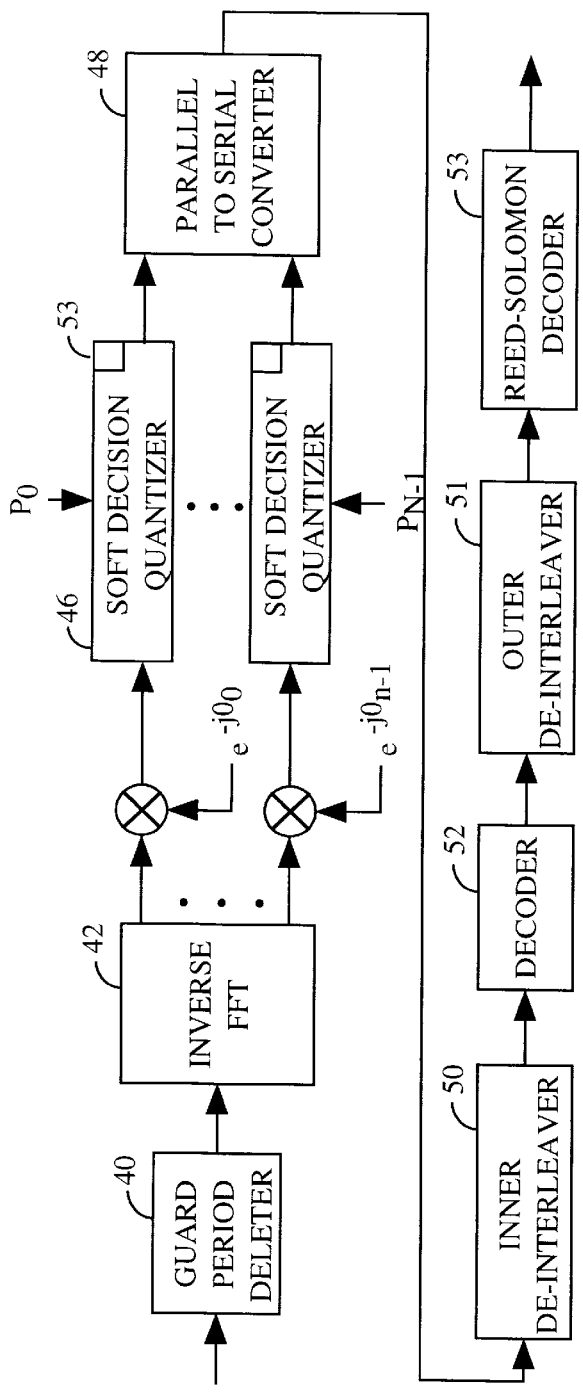
FIG. 3 is a schematic diagram showing the relevant portions of a receiver of the present invention.

Now referring to FIG. 3, the relevant portions of the receiver 12 of the present invention can be seen. The received signal is sent to a guard period deleter 40, which deletes the guard periods inserted by the transmitter 14 by processing only the energy received during the useful signal period. From the deleter 40 the signal is sent to an inverse FFT 42 for transforming the signal back to the time domain.

As shown in FIG. 3, the inverse FFT 42 outputs substreams of received complex data symbols $\bar{d}_0 \ldots \bar{d}_{n-1}$. Each symbol is combined in a respective multiplier 44 with a respective phase rotation correction vector $e^{-j\varnothing}$, wherein ∅ is the estimated phase rotation of the symbol based on the pilot signal inserted at the transmitter 14.

Next, the value of the bits represented by each complex symbol in the respective substreams is determined by respective soft decision quantizers 46. Thus, the quantizers 46 decode the complex symbols back to the data bits that they respectively represent. The method by which the bit values of each symbol are determined are set forth below in reference to FIG. 4. As indicated in FIG. 3, however, to facilitate rendering the soft decisions, the quantizers 46 receive respective estimates "ρ" of the amplitudes of the received symbols, based on the pilot signals.

From the quantizers 46, the substreams of data bits are sent to a parallel to serial converter 48, to combine the substreams into a single sequence of data bits. Then, the data bit sequence is sent to a de-interleaver 50 for reordering the bits into the order they were in before being interleaved by the inner interleaver 28 of the transmitter. Next, the de-interleaved bits are sent to a decoder 52 for decoding the bits in accordance with convolutional coding schemes well-known in the art. One possible embodiment of convolutional decoder 52 is the Viterbi decoder the design of which is well known in the art. The output of decoder 52 is provided to outer deinterleaver 51 which reorder convolutionally decoded symbols. The reordered symbols are then provided to Reed Solomon decoder 53 which decodes the reordered symbols as is well known in the art.

Figure 4:
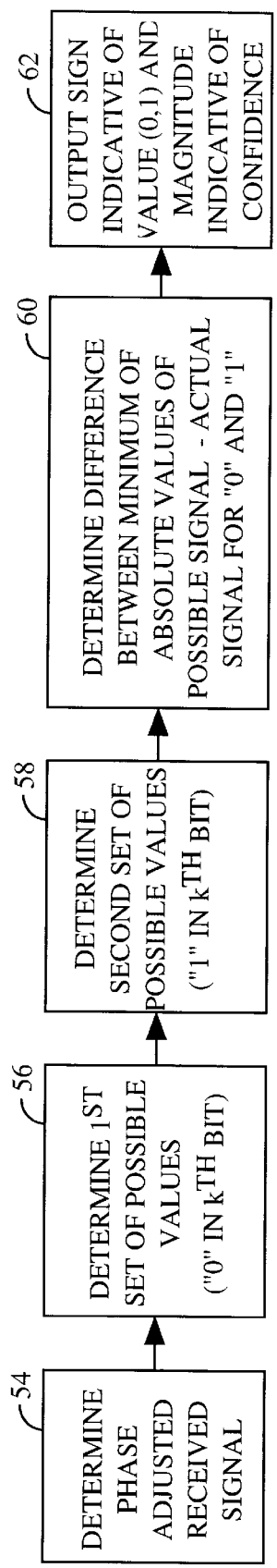
FIG. 4 is a flow chart showing the soft decision logic of the present receiver.

FIG. 4 shows the logic of a soft decision quantizer 46 of the present invention in determining the values of the bits represented by a received complex symbol. As can be appreciated in reference to FIG. 3, each quantizer 46 can be a microprocessor that preferably includes a data storage device 53, which includes instructions that are used by the quantizer 46 to undertake the steps of the present invention.

Accordingly, those skilled in the art will recognize that the quantizer 46 can include a programmable central processing unit (CPU), or a programmable gate array chip, or an application specific integrated circuit (ASIC).

FIG. 4 illustrates the structures of various embodiments of the logic of the present invention as embodied in computer-readable logic structures on the storage device 53 (FIG. 3). Those skilled in the art will appreciate that FIG. 4 illustrates the structures of logic elements that function according to this invention. Manifestly, the invention is practiced in one essential embodiment by a machine component that renders the logic elements in a form that instructs a digital processing apparatus (that is, a computer or microprocessor) to perform a sequence of operational steps corresponding to those shown in FIG. 4.

These instructions may reside in, i.e., be embodied by, logic structures/circuits on a data storage device including a data storage medium, such as the storage device 53 shown in FIG. 3. The machine component can be a combination of logic elements that are embodied in the storage device 53, which advantageously can be electronic read-only memory (ROM) or electronic random access memory (RAM), or other appropriate data storage device. Alternatively, the instructions can be embodied in the form of computer program code elements on semiconductor devices, on magnetic tape, on optical disks, on a DASD array, on magnetic tape, on a conventional hard disk drive, on electronic read-only memory or on electronic random access memory, or other appropriate data storage device.

Commencing at block 54, the phase-adjusted signal $\bar{d}_i e^{-j\phi}$ (the value of i denoting the $i^{th}$ symbol) for each received complex symbol is received from the multiplier 44 as disclosed above by the quantizer 46 of the present invention. Then, at block 56, a first set of possible values $\rho_i \alpha$ that the received complex symbol can have is determined. The values for the $\alpha$'s are known a priori, because each of these corresponds to a position in the predetermined constellation geometry. This first set includes $2^{m-1}$ elements $\rho_i \alpha$ each element having a binary "0" in a $k^{th}$ bit, k=1 to m. In other words, at block 56 a first set of possible values is determined for each symbol, with each value in the first set having a binary value of "0" in a predetermined bit.

Likewise, at block 58, a second set of possible values $\rho_i \alpha$ that the received complex symbol can have is determined. This second set includes $2^{m-1}$ elements $\rho_i \alpha$ each element having a binary "1" in the $k^{th}$ bit, k=1 to m. In other words, at block 58 a second set of possible values is determined for each symbol, with each value in the second set having a binary value of "1" in a predetermined bit. Thus, in the 32 value constellation shown above in the table, sixteen possible values are output at block 56 and another sixteen are output at block 58.

Next, at block 60, the absolute values of the differences between the phase-adjusted signal $\bar{d}_i e^{-j\phi(i)}$ and each expected signal $\rho_i \alpha$ in the first set is determined, and the smallest absolute value selected as a first signal. Also at block 60, the absolute values of the differences between the phase-adjusted signal $\bar{d}_i e^{-j\phi(i)}$ and each expected signal $\rho_i \alpha$ in the second set is determined, and the smallest absolute value selected as a second signal. The output of block 60 can be expressed as:

$$\min|\bar{d}_i e^{-j\phi(i)} - \rho_i\alpha(0 \text{ in } k^{th} \text{ bit})|^2 - |\bar{d}_i e^{-j\phi(i)} - \rho_i\alpha(1 \text{ in } k^{th} \text{ bit})|^2 \quad (1)$$

While the particular BIT INTERLEAVER FOR ORTHOGONAL FREQUENCY DIVISION MULTIPLEXING IN THE TRANSMISSION OF DIGITAL SIGNALS as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims.

We claim:

1. A device for communicating a stream of digital data using an orthogonal frequency division multiplexing (OFDM) transmission system, the OFDM transmission system including transmitters and receivers, the device comprising:

an outer symbol interleaver, configured to receive the stream of digital data composed of a first sequence of bits, said outer interleaver for interleaving the first sequence of bits to produce a second sequence of bits;

an encoder for encoding the second sequence of bits to produce a third sequence of bits;

an inner bit interleaver for interleaving the third sequence of bits to produce a fourth sequence of bits;

a signal space grouper for generating a plurality of symbols, wherein each of the plurality of symbols represent "m" successive bits of the fourth sequence of bits, wherein "m" is an integer value greater than one;

a signal space mapper for mapping the plurality of symbols onto a plurality of complex symbols; and a serial-to-parallel converter for multiplexing the plurality of complex signals into a plurality of substreams.

2. The device of claim 1, wherein the outer symbol interleaver is a Reed-Solomon interleaver.

3. The device of claim 1, wherein the signal space mapper uses quadrature amplitude modulation (QAM) to produce the plurality of complex symbols.

4. The device of claim 1, wherein "m" is an odd integer at least equal to five (5), and the signal space mapper produces the plurality of complex symbols in accordance with a Hamming distance calculation.

5. The device of claim 1, wherein the device further comprises a guard period generator for establishing a guard period in each of the plurality of substreams.

6. A method for communicating a stream of digital data using an orthogonal frequency division multiplexing (OFDM) transmission system, the OFDM transmission system including transmitters and receivers, the method comprising the steps of:

symbol interleaving a first sequence of bits to produce a second sequence of bits;

encoding the second sequence of bits to produce a third sequence of bits;

bit interleaving the third sequence of bits to produce a fourth sequence of bits;

generating a plurality of complex symbols representative of "m" successive bits of the fourth sequence of bits, wherein "m" is an integer value greater than one; and multiplexing the plurality of complex symbols into a plurality of substreams.

7. The method of claim 6, wherein the step of generating the plurality of complex symbols representative of "m" successive bits of the fourth sequence of bits includes the step of using quadrature amplitude modulation (QAM) to generate the plurality of complex symbols.

8. The method of claim 7, wherein "m" equals seven (7).

9. The method of claim 7, wherein the step of symbol interleaving the first sequence of bits is preceded by the step of encoding the first sequence of bits.

10. The method of claim 9, further comprising the steps of:

transforming each of the plurality of substreams with a Fast Fourier Transform (FFT); and generating a plurality of guard periods, each of the plurality of guard periods associated with one of the plurality of transformed substreams.

* * * * *